(12) United States Patent
Zhai et al.

(10) Patent No.: US 10,475,867 B2
(45) Date of Patent: Nov. 12, 2019

(54) ORGANIC LIGHT-EMITTING DISPLAY PANEL AND DISPLAY APPARATUS THEREOF

(71) Applicant: SHANGHAI TIANMA MICRO-ELECTRONICS CO., LTD., Shanghai (CN)

(72) Inventors: Yingteng Zhai, Shanghai (CN); Haijing Chen, Shanghai (CN)

(73) Assignee: SHANGHAI TIANMA MICRO-ELECTRONICS CO., LTD., Shanghai (CN)

(*) Notice: Subject to any disclaimer, the term of this patent is extended or adjusted under 35 U.S.C. 154(b) by 0 days.

(21) Appl. No.: 15/946,396

(22) Filed: Apr. 5, 2018

(65) Prior Publication Data

US 2019/0237523 A1    Aug. 1, 2019

(30) Foreign Application Priority Data

Jan. 29, 2018   (CN) .......................... 2018 1 0083364

(51) Int. Cl.
   *H01L 27/32*   (2006.01)
   *H01L 51/52*   (2006.01)
   *H01L 51/00*   (2006.01)

(52) U.S. Cl.
   CPC ...... *H01L 27/3246* (2013.01); *H01L 27/3216* (2013.01); *H01L 51/0097* (2013.01); *H01L 51/5268* (2013.01); *H01L 2251/5338* (2013.01)

(58) Field of Classification Search
   CPC ............ H01L 27/3246; H01L 27/3216; H01L 51/0097; H01L 51/5268; H01L 2251/5338
   USPC ............................................................ 257/40
   See application file for complete search history.

(56) References Cited

U.S. PATENT DOCUMENTS

| 2014/0320543 | A1* | 10/2014 | Oh ........................ H01L 27/326 345/690 |
| 2016/0240818 | A1* | 8/2016 | Chung ................ H01L 51/5271 |
| 2018/0205040 | A1* | 7/2018 | Kim .................... H01L 51/5278 |
| 2018/0331325 | A1* | 11/2018 | Zhang ................. H01L 51/5271 |

FOREIGN PATENT DOCUMENTS

CN           105023934 A      11/2015

* cited by examiner

*Primary Examiner* — Karen Kusumaker
*Assistant Examiner* — Adam S Bowen
(74) *Attorney, Agent, or Firm* — Anova Law Group PLLC

(57) ABSTRACT

An organic light-emitting display panel and a display apparatus are provided. An exemplary organic light-emitting display panel includes a base substrate; a pixel definition layer including a plurality of openings and disposed on the base substrate; and a plurality of sub-pixels. A sub-pixel includes an organic light-emitting diode; and at least a portion of the organic light-emitting diode is in an opening. The plurality of sub-pixels include at least one first sub-pixel; and at least one isolation element is disposed in the opening corresponding to the at least one first sub-pixel.

20 Claims, 8 Drawing Sheets

ORGANIC LIGHT-EMITTING DISPLAY PANEL AND DISPLAY APPARATUS THEREOF

CROSS-REFERENCES TO RELATED APPLICATIONS

This application claims priority of Chinese Patent Application No. 201810083364.9, filed on Jan. 29, 2018, the entire contents of which are hereby incorporated by reference.

FIELD OF THE INVENTION

The present disclosure generally relates to the field of display technology and, more particularly, relates to an organic light-emitting display panel and a display apparatus thereof.

BACKGROUND

Display panels include liquid crystal display panels, organic light-emitting display panels and electronic papers, etc. An organic light-emitting display panel includes organic light-emitting diodes (OLEDs). OLED technology has the advantages of self-emitting, wide viewing angle, almost infinitely high contrast, low power-consumption and ultra-fast response speed, etc. Further, the organic light-emitting display panel can be fabricated as a flexible display panel, which is bendable, foldable and rollable.

An OLED often includes an anode, a cathode and an organic light-emitting material element sandwiched between the anode and the cathode. When an appropriate voltage is applied between the anode and the cathode, the holes in the anode and the electrons in the cathode may combine in the organic light-emitting material element to emit light. By designing the organic light-emitting material in the organic light-emitting material element, different OLEDs are able to emit lights of different colors.

When an organic light-emitting panel is under a bended status, the viewing angle of the viewer is correspondingly changed, as illustrated in FIG. 1. FIG. 1 illustrates an existing organic light-emitting display panel 01. As shown in FIG. 1, the angle between the light of sight of the viewer and the normal of the displaying surface is referred as a viewing angle. Specifically, the angle between the light of sight of the viewer and the normal of the display plane at the position "A" is "α"; and the angle between the light of sight of the viewer and the normal of the display plane at the position "B" is "β". The organic light-emitting panel 01 at the position "B" is at the bended status, where the viewing angle "β" is obviously increased.

However, the chromaticity of an organic light-emitting material often has attenuations at large viewing angles. The larger the viewing angle is, the larger the chromaticity attenuation of the OLED is. Further, the existing organic light-emitting display panel includes red OLEDs, green OLEDs and blue OLEDs. When the viewing angle is continuously increased, the change scales of the chromaticity of different colors of OLEDs are different. Under the large viewing angle status, the chromaticity attenuation of the blue OLED is substantially small, and the color saturation is substantially high. Thus, the image of the organic light-emitting display panel under large viewing angles conditions shows blue tone. When the viewing angle of the organic light-emitting display panel being bended is increased, the blue tone issue of the image may become more severe, such that the display quality/performance of the organic light-emitting display panel may be significantly degraded.

The disclosed display panel and display apparatus are directed to solve one or more problems set forth above and other problems in the art.

BRIEF SUMMARY OF THE DISCLOSURE

One aspect of the present disclosure provides an organic light-emitting display panel. The organic light-emitting display panel includes a base substrate; a pixel definition layer including a plurality of openings and disposed on the base substrate; and a plurality of sub-pixels. A sub-pixel includes an organic light-emitting diode; and at least a portion of the organic light-emitting diode is disposed in an opening. The plurality of sub-pixels include at least one first sub-pixel; and at least one isolation element is disposed in the opening corresponding to one first sub-pixel.

Another aspect of the present disclosure provides a display apparatus. The display apparatus includes at least an organic light-emitting display panel. The organic light-emitting display panel includes a base substrate; a pixel definition layer including a plurality of openings and disposed on the base substrate; and a plurality of sub-pixels. A sub-pixel includes an organic light-emitting diode; and at least a portion of the organic light-emitting diode is in an opening. The plurality of sub-pixels include at least one first sub-pixel; and at least one isolation element is disposed in the opening corresponding to the at least one first sub-pixel.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Figure 1:
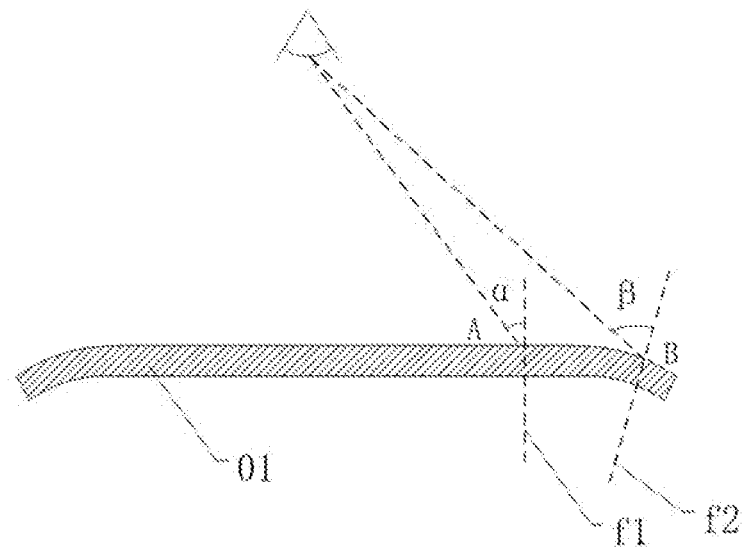
FIG. 1 illustrates a cross-sectional view of an existing organic light-emitting display panel.

Reference will now be made in detail to exemplary embodiments of the invention, which are illustrated in the accompanying drawings. Hereinafter, embodiments consistent with the disclosure will be described with reference to drawings. Wherever possible, the same reference numbers will be used throughout the drawings to refer to the same or like parts. It is apparent that the described embodiments are some but not all of the embodiments of the present disclosure. Based on the disclosed embodiments, persons of ordinary skill in the art may derive other embodiments consistent with the present disclosure, all of which are within the scope of the present invention. Further, in the present disclosure, the disclosed embodiments and the features of the disclosed embodiments may be combined under conditions without conflicts.

The techniques, methods and apparatus that are familiar to the persons of ordinary skill in the art may not be described in detail. However, under appropriate conditions, such techniques, methods and apparatus are included as the parts of the description.

In the disclosed embodiments, the specific values should be explained for illustrative purposes only and should not be used as limitations. Thus, some other embodiments may have different values.

Further, the similar symbols and letters in the drawings denote similar elements. Thus, once one element is defined in one drawing, it may not need to be defined in the following drawings.

The present disclosure provides an organic light-emitting display panel with improved display performance.

Figure 2:
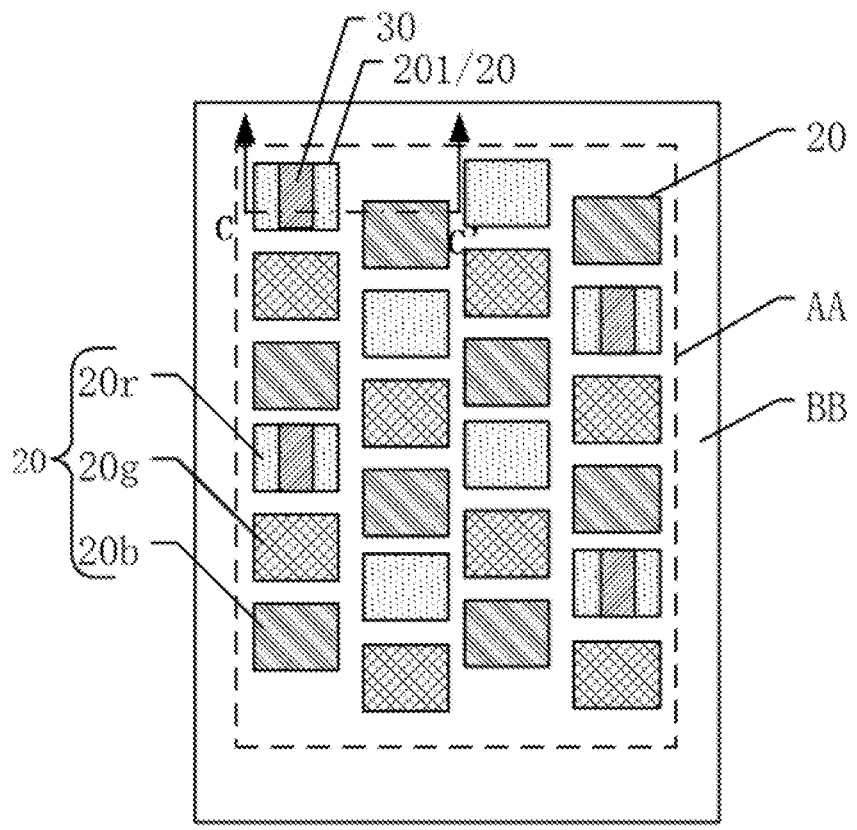
FIG. 2 illustrates a top view of an exemplary organic light-emitting display panel consistent with various disclosed embodiments.
Figure 3:
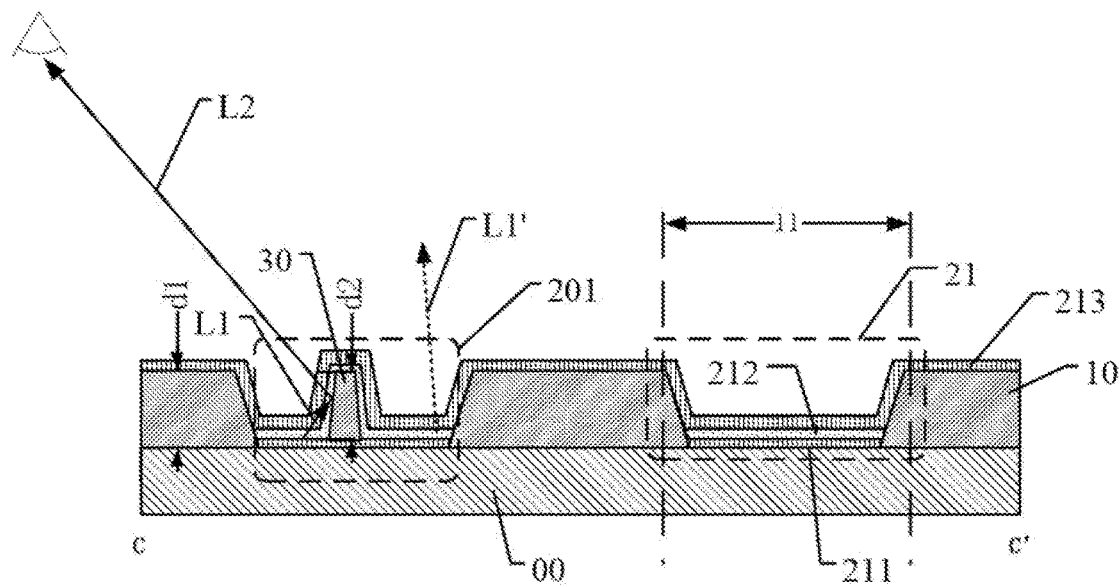
FIG. 3 illustrates a CC'-sectional view of the organic light-emitting display panel illustrated in FIG. 2.

FIG. 2 and FIG. 3 illustrates a corresponding organic light-emitting display panel consistent with various disclosed embodiments. FIG. 3 is the CC'-sectional view of the display panel in FIG. 2.

As shown in FIG. 2 and FIG. 3, the organic light-emitting display panel may include a base substrate 00 and a pixel definition layer 10 disposed on the base substrate 00. The pixel definition layer 10 may include a plurality of openings 11.

Further, the organic light-emitting display panel may include a plurality of sub-pixels 20. Each of the plurality of sub-pixels 20 may include an organic light-emitting diode (OLED) 21. At least a portion of the OLED 21 may be disposed within the opening 11. The OLED 21 may include a first electrode 211, a light-emitting material element 212 and a second electrode 213. Each sub-pixel 20 may include one first electrode 211; and the first electrodes 211 of different sub-pixels 20 may be independent of each other.

The plurality of sub-pixels 20 may include at least one first sub-pixel 201. At least one isolation element 30 may be disposed in the opening 11 corresponding to one first sub-pixel 201. The isolation element 30 and the pixel definition layer 10 may be disposed in a same layer. The portion of the pixel definition layer 10 outside the opening 11 may have a thickness of "d1". The isolation element 30 may have a height of "d2". In one embodiment, d2≥d1. The plurality of sub-pixels 20 may include red sub-pixels 20r, green sub-pixels 20g and blue sub-pixels 20b. The first sub-pixel 201 may include at least one red sub-pixel 20r.

The disclosed organic light-emitting display panel may be a rigid organic light-emitting display panel, or a flexible organic light-emitting display panel. In the rigid organic light-emitting display panel, the base substrate 00 may include a rigid base substrate. For example, glass may be used to form the rigid base substrate. In the flexible organic light-emitting display panel, the base substrate 00 may include a flexible base substrate. For example, resin may be used to form the flexible substrate. The material and the flexibility of the base substrate are not limited by the present disclosure.

The pixel definition layer 10 may be disposed on the base substrate 00. The pixel definition layer 10 may be made of an organic material, or an inorganic material. The pixel definition layer 10 may be used to define the positions of the OLEDs 21. That is, the pixel definition layer 10 may be used to define the light-emitting regions of the OLEDs 21. The openings 11 may be formed in the pixel definition layer 10; and at least a portion of the OLED 21 may be disposed in the opening 11. In one embodiment, the entire OLED 21 may be disposed in the opening 11. In another embodiment, only a portion of an OLED 21 may be disposed in the opening 11. For example, considering the process errors of the practical manufacturing process, to ensure entire regions corresponding to the openings 11 to be the light-emitting regions of the OLEDs 21, the area of the first electrode 211 and/or the second electrode 213 of the OLED 21 may be greater than the area of the opening 11. That is, the projection of the opening 11 onto the organic light-emitting display panel may be within the projection of the first electrode 211 and/or the second electrode 213 onto the organic light-emitting display panel.

In the disclosed embodiments, the organic light-emitting display panel may include a plurality of sub-pixels 20. In one embodiment, as shown in FIG. 2, the plurality of sub-pixels 20 may be disposed in a display region AA; and the plurality of sub-pixels 20 may be used to achieve the display function. The organic light-emitting display panel may also include a non-display region BB. As shown in FIG. 2, for illustrative purposes, the display region AA may be square-shaped, and the non-display region BB may surround the display region AA. The shape and the size of the display region AA and the non-display region BB and the position relationship between the display region AA and the non-display region BB are not limited by the present disclosure.

The OLED 21 may include the first electrode 211, the organic light-emitting material element 212 and the second electrode 213. After applying an appropriate voltage between the first electrode 211 and the second electrode 213, the holes generated in the first electrode 211 and the electrons generated in the second electrode 213 may combine in the organic light-emitting material element 212, and the organic light-emitting material element 212 may emit light. In one embodiment, each of the first sub-pixels 20 may include one first electrode 211; and the first electrodes 211 of different sub-pixels 20 may be independent of each other. That is, the first electrodes 211 of any two sub-pixels 211 may not be connected together. In another embodiment, the second electrodes 213 of the sub-pixels 20 may be connected together and may receive a same electric signal. In one embodiment, the first electrode 211 of the sub-pixel 20 may be an anode, and the second electrode 213 of the sub-pixel 20 may be a cathode.

The organic light-emitting material element 212 may include an organic light-emitting material. By designing the organic light-emitting material of the light-emitting material elements 212, the OLEDs 21 may be able to emit different colors of light.

To enable the organic light-emitting display panel to display color images, the plurality of the sub-pixels 20 may have different colors. The color of the sub-pixel 20 may be referred to the color of the light emitted by the OLED 21. In one embodiment, the plurality of sub-pixels 20 may include the red sub-pixels 20r, the green sub-pixels 20g and the blue sub-pixels 20b. Red, green and blue are three primary colors. By combining the three primary colors, a color display may be achieved. The red sub-pixels 20r may include at least one first sub-pixel 201. In the disclosed organic light-emitting display panel, the plurality of sub-pixels 20 may also include sub-pixels having a fourth color, for example, sub-pixels emitting white light, yellow light or other appropriate light, which is not limited by the present disclosure.

In the red sub-pixel 20r, a red light-emitting material may be doped in the light-emitting material element 212 of the organic light-emitting diode to emit red light. In the green sub-pixel 20g, a green light-emitting material may be doped in the light-emitting material element 212 of the organic light-emitting diode to emit green light. In the blue sub-pixel 20b, a blue light-emitting material may be doped in the light-emitting material element 212 of the organic light-emitting diode to emit blue light. During the fabrication of the OLEDs 21, the light-emitting material elements of the OLEDs 21 may be formed by an evaporation method. The method for forming the light-emitting material elements is not limited by the present disclosure and may be selected according to various application scenarios.

Figure 4:
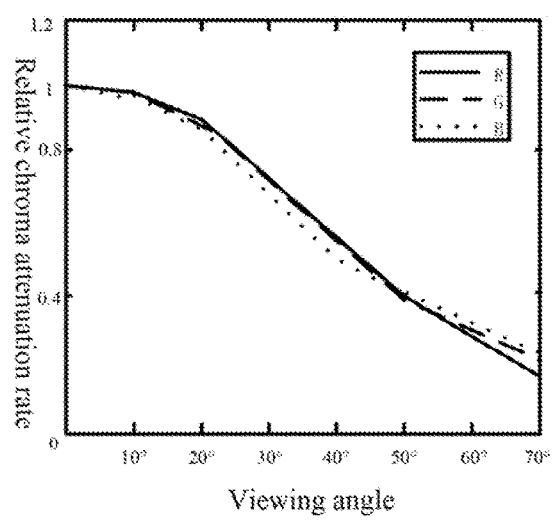
FIG. 4 illustrates a viewing angle dependent relative chromaticity attenuation of a light-emitting material in an existing organic light-emitting display panel.

In the existing technologies, the chromaticity attenuation rates of the red light-emitting material, the green light-emitting material and the blue light-emitting material at large viewing angles are different. FIG. 4 illustrates a viewing angle dependent relative chromaticity attenuation of a light-emitting material in an existing organic light-emitting display panel. The abscissa denotes the viewing angle; the ordinate denotes the relative chromaticity attenuation rate; the graph R denotes the red light-emitting material; the graph G denotes the green light-emitting material; and the graph B denotes the blue light-emitting material.

When the viewing angle is 0°, the relative chromaticity attenuation rates of the red light-emitting material, the green light-emitting material and the blue light-emitting material are all 1, where the chromaticity of the red light-emitting material, the green light-emitting material and the blue light-emitting material are at the maximum value. A larger relative chromaticity attenuation rate indicates that the light-emitting material has a smaller change of the chromaticity attenuation with the change of the viewing angle. When the viewing angle is within a range of 10°-55°, at the same viewing angle, the relative chromaticity attenuation rate of the blue light-emitting material is at the minimum value. That is, when the viewing angle is within the range of 10°-55°, comparing with the red light-emitting material and the green light-emitting material, the color saturation of the blue sub-pixel 20b is substantially low. When the viewing angle is greater than 55°, at the same viewing angle, the relative chromaticity attenuation rate of the red light-emitting material is at the minimum value; and the relative chromaticity attenuation rate of the blue light-emitting material is at the maximum value. That is, when the viewing angle is greater than 55°, the color saturation of the red sub-pixel 20r may be substantially low and the color saturation of the blue sub-pixels 20b may be substantially high. Thus, the displayed image may have a blue tone issue.

According to the habits of the users, when the user is watching a display panel, the viewing angle is usually in a range of 10°-55°. Thus, through configuring a substantially large area of blue sub-pixels, the luminous quantity may be increased, the effect caused by the reduction of the color saturation of the blue light-emitting material may be balanced, and the display panel may have a desired white balance.

However, in the region of the organic light-emitting display panel adjacent to the non-display region BB and the curved region of the organic light-emitting display panel, the viewing angle is easily greater than 55° when the user is watching the display panel. When the viewing angle is greater than 55°, among of the three primary colors, the red light may have the minimum relative chromaticity attenuation rate, while the blue light may have maximum relative chromaticity attenuation rate. Thus, the region of the organic light-emitting display panel adjacent to the non-display region BB and the curved region of the organic light-emitting display panel are easy to have the blue tone issue.

In one embodiment, at least one isolation element 30 may be disposed in the red sub-pixel 20r, such that the blue tone issue of the displayed image caused by the relative small relative chromaticity attenuation rate of the red sub-pixel 20r at the large viewing angle may be reduced, and the image quality may be improved. The isolation element 30 may be made of an organic material, or an inorganic material, which is not limited by the present disclosure.

In particular, because the isolation element 30 may be disposed in the opening 11 corresponding to the first sub-pixel 201, the light emitted from the OLED 21 may be scattered when the light irradiates the sidewalls of the isolation element 30. Referring to the light "L1" illustrated in FIG. 3, a major portion of the light emitted from the OLED 21 may emit along the direction parallel to the normal of the plane having the display panel or the direction having a small angle with the normal of the plane having the display panel; and only a small portion of the light emitted from the OLED 21 may emit along the direction having a large angle with the normal of the plane having the display panel. That is, at the large viewing angle, when the chromaticity of all colors of lights is attenuated, the brightness of all colors of lights may also be reduced simultaneously.

In one embodiment, the isolation element 30 may be disposed in the red sub-pixel, because the light has a wave-guide phenomenon, when the light L1, which is parallel to the normal of the plane having the display panel or having a small angle with the normal of the plane having the display panel, reaches the isolation element 30, the light L1 may be scattered. Then the scattered light L2 may be generated, and the scattered light L2 may emit out. The emitting direction of the scattered light L2 may be changed relative to the light L1, and the amount of the red light irradiated into the eyes of the user at large viewing angles may be increased.

Comparing with the existing technique without disposing an isolation element, the isolation element 30 may increase the length of the sidewalls of the red sub-pixel in which the sidewalls of the red pixel has the scattering function. Further, the height d2 of the isolation element 30 may be substantially large such that the height of the side surfaces of the isolation element 30 may be substantially large, and the area of the sidewalls of the isolation element 30 may be increased. Thus, through disposing the isolation element 30, the scattered power of the light emitted from the OLED 21 after irradiating to the isolation element 30 may be increased. Accordingly, the brightness of the red sub-pixel at large viewing angles may be increased, the blue tone issue of the display panel at the large angles may be reduced, and the display quality/performance may be enhanced.

At a large viewing angle, comparing with the red sub-pixel 20r and the green pixel 20g, the blue pixel 20b may have a substantially small chromaticity attenuation, and a substantially high color saturation. Thus, the image of the organic light-emitting display panel may have a blue tone issue at the large viewing angle. At the large view angle, the chromaticity attenuation rate of the red light-emitting material of the red sub-pixel 20r may be substantially small; and the color saturation of the red sub-pixel 20r may be substantially low. Thus, the visual impact of the red sub-pixel 20r to the human eyes may be substantially small; and the human eyes may not be easy to sense the red sub-pixel 20r.

In one embodiment, the display panel may include a plurality of red sub-pixels 20r, the brightness of one or more of the red pixels 20r disposed with the isolation element 30 may be increased; and the visual impact of the red sub-pixels 20r to the human eyes may be enhanced. Thus, the blue tone issue of the image caused by the substantially small chromaticity attenuation rate of the red sub-pixel 20r at the large viewing angle may be balanced; and the display quality may be improved.

Figure 5:
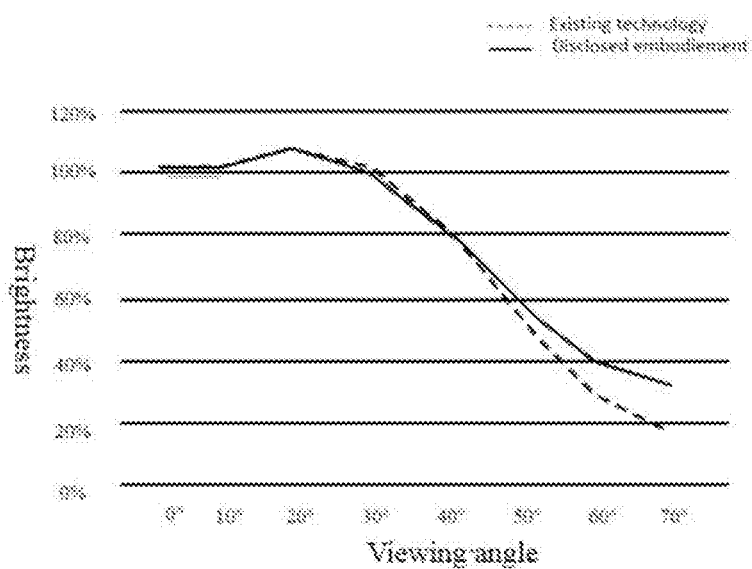
FIG. 5 illustrates viewing angle dependent brightness of the existing display panel and an exemplary organic light-emitting display panel consistent with various disclosed embodiments.

FIG. 5 illustrates viewing angle dependent brightness of the existing display panel and an exemplary organic light-emitting display panel consistent with various disclosed embodiments.

The broken line in FIG. 5 illustrates the correlation between the brightness of the red sub-pixel without having an isolation element and the viewing angle. The solid line in FIG. 5 illustrates the correlation between the brightness of the red sub-pixel having at least one isolation element and the viewing angle.

As shown in FIG. 5, when the viewing angle is greater than 40°, with the increase of the viewing angle, the reduction rate of the brightness of the red sub-pixel of the existing organic light-emitting display panel is greater than the reduction rate of the brightness of the red sub-pixel of the disclosed organic light-emitting display panel. Thus, at the same viewing angle, the brightness of the red sub-pixel of the existing organic light-emitting display panel is smaller than the brightness of the red sub-pixel of the disclosed organic light-emitting display panel. For example, when the viewing angle is 50°, the brightness of the red sub-pixel of the existing organic light-emitting display panel is approximately 42%; and the brightness of the red sub-pixel of the disclosed organic light-emitting display panel is approximately 58%.

Further, as the viewing angle become larger, the difference between the brightness of the red sub-pixel of the existing organic light-emitting display panel and the brightness of the red sub-pixel of the disclosed organic light-emitting display panel may also become larger. That is, the isolation element in the red sub-pixel in the disclosed organic light-emitting display panel may be able to increase the brightness at the large viewing angle. In one embodiment, by increasing the brightness of the red sub-pixel at the large viewing angle, the visual impact of the red sub-pixel to human eyes may be increased; and the chromaticity attenuation of the red light-emitting material caused by the increase of the viewing angle may be balanced. Accordingly, the organic light-emitting display panel may have a desired white balance; and the blue tone issue of the image at the large viewing angle may be reduced; and the display quality may be improved.

In one embodiment, the first sub-pixel 201 may be disposed in a portion of the organic light-emitting display panel. For example, the first sub-pixel 201 may be disposed in the region adjacent to the non-display region BB. According to the habits of the users, the region adjacent to non-display region BB may be likely to become a large viewing angle region. Thus, the blue tone issue of the image of the organic light-emitting panel at the large viewing angle may be reduced; and the display quality of the organic light-emitting display panel may be improved.

Figure 6:
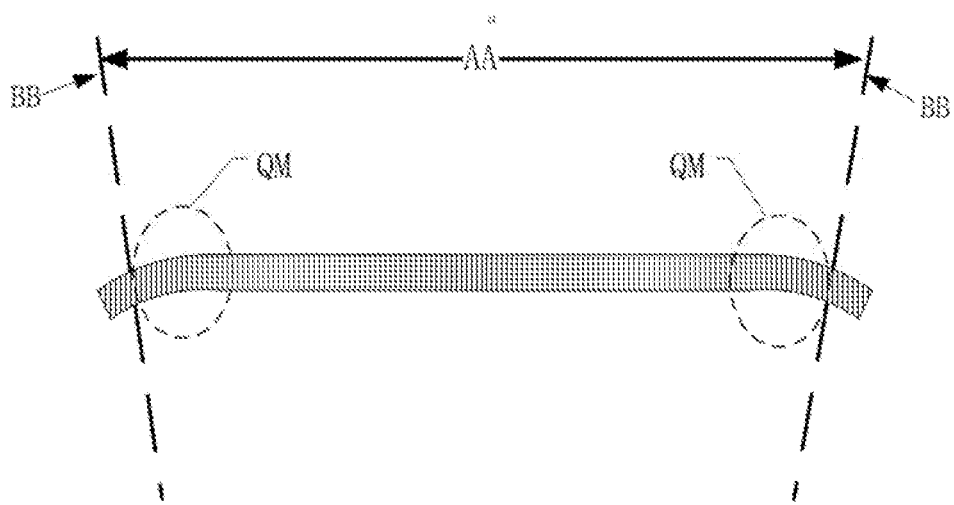
FIG. 6 illustrates a cross-sectional view of another exemplary organic light-emitting display panel consistent with various disclosed embodiments.

Further, in one embodiment, the organic light-emitting display panel may be a curved display panel. The organic light-emitting display panel may include a flat region and a curved region; and the first sub-pixel 201 may be in the curved region. FIG. 6 illustrates a corresponding curved organic light-emitting display panel consistent with various disclosed embodiments. As shown in FIG. 6, the curved organic light-emitting display panel may include a curved region QM. The portion of the organic light-emitting display panel in the curved region QM may be at a curved status; and may not be at a flat status. When the organic light-emitting display panel desires to be curved, the sub-pixels in the curved region QM may be in the large viewing angle region of the user. Thus, the first sub-pixel 201 may be disposed in the curved region QM of the organic light-emitting display panel. Accordingly, the blue tone issue of the image of the organic light-emitting display panel under the curved status may be reduced; and the display quality of the organic light-emitting display panel may be improved.

Figure 7:
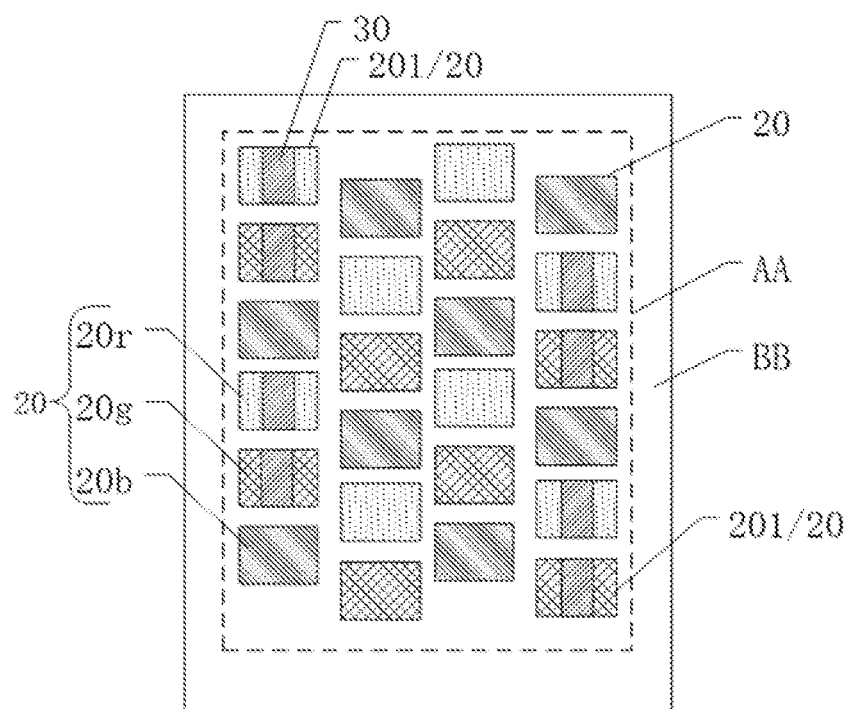
FIG. 7 illustrates a top view of another exemplary organic light-emitting display panel consistent with various disclosed embodiments.

Further, referring to FIG. 4 and FIG. 7, the first sub-pixel 201 may also include at least one green sub-pixel 20g. When the viewing angle is greater than 55°, at a certain viewing angle, the attenuation rate of the relative chromaticity of the red light-emitting material may be at the minimum value and the attenuation rate of the relative chromaticity of the blue light-emitting material may be at the maximum value. The attenuation rate of the relative chromaticity of the green light-emitting material may be smaller than the attenuation rate of the relative chromaticity of the blue light-emitting material. That is, when the viewing angle is greater than 55°, the brightness of the green light-emitting material may be substantially low. Thus, in one embodiment, the isolation element 30 may be disposed both in the blue sub-pixel 20g and the red sub-pixel 20r. Accordingly, the brightness of the green sub-pixel 20g and the brightness of the red pixel 20r at the large viewing angle may be both increased; and the blue tone issue of the image caused by the substantially small chromaticity attenuation rate of the green sub-pixel and the red sub-pixel may be further reduced; and the display quality/performance may be improved.

Further, referring to FIG. 2 and FIG. 3, in one embodiment, the isolation element 30 and the pixel definition layer 10 may be made of a same material. Thus, in the fabrication of the disclosed organic light-emitting display panel, the isolation element 30 and the pixel definition layer 10 may be formed by a same process. By patterning a same material layer, the isolation element 30 and the pixel definition layer 10 may be formed simultaneously. Thus, no extra process may be desired to form the isolation element 30; and/or no extra material may be desired to form the isolation element 30. Accordingly, the efficiency for forming the organic light-emitting display panel may be increased; and the production cost may be reduced. The isolation element 30 may be made of any appropriate material, such as at least one of resin, polyimide, organic silicon, and silicon oxide. The resin, polyimide, organic silicon, and silicon oxide may aid the isolation element 30 to increase the light scattering. The isolation element 30 made of the resin material and/or the polyimide material may have a desired flexibility; and may be used to form a flexible organic light-emitting display panel. The organic silicon and the silicon oxide may have a desired compactness and an anti-erosion ability.

In the disclosed organic light-emitting display panel, the shape and the position of the isolation element 30 may have a plurality of configurations. The specific configurations of the isolation element 30 may be described as following.

Figure 8:
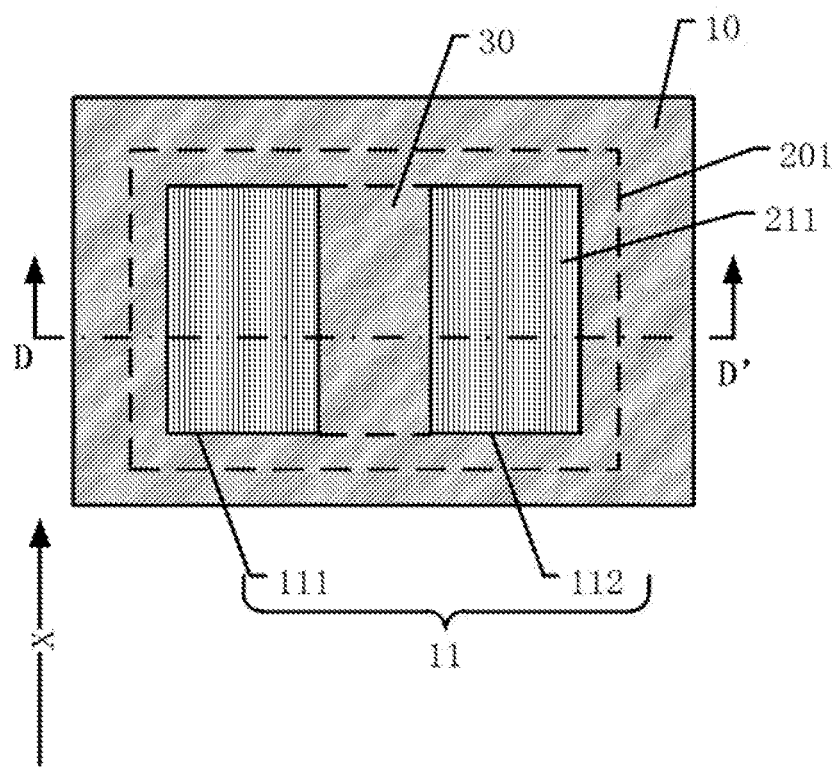
FIG. 8 illustrates a top view of an exemplary first sub-pixel in another exemplary organic light-emitting display panel consistent with the disclosed embodiments.
Figure 9:
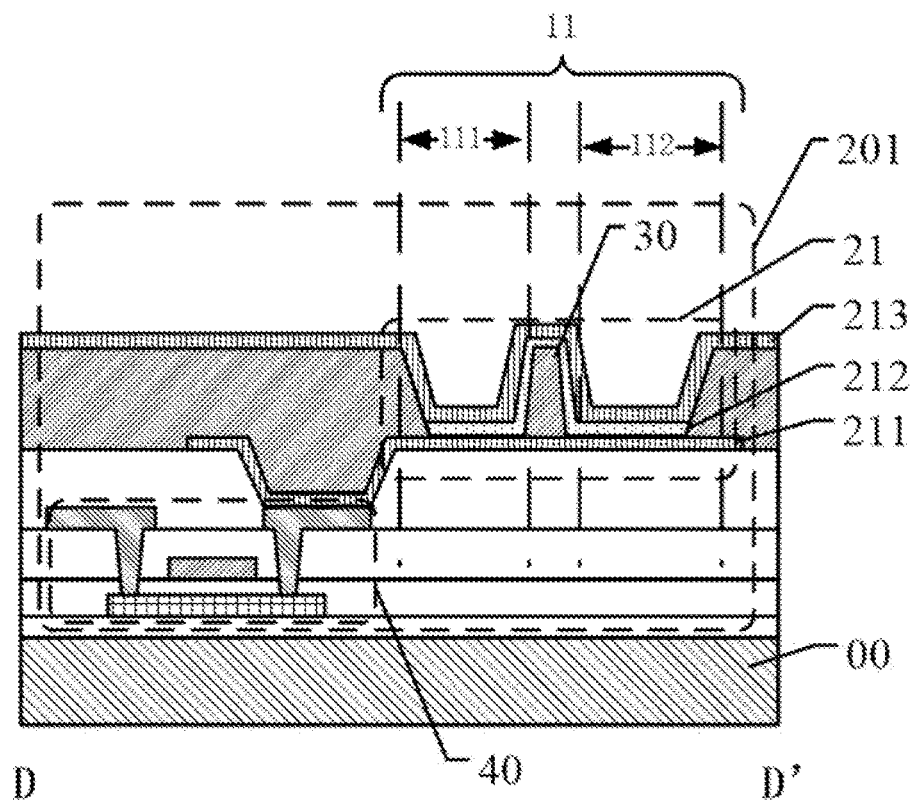
FIG. 9 illustrates a DD'-sectional view of an exemplary first sub-pixel in FIG. 8.

In one embodiment, as shown in FIG. 8 and FIG. 9, the isolation element 30 may be stripe-shaped along a first direction x and the two ends of the isolation element 30 may be connected with the sidewalls of the opening 11 respectively. The isolation element 30 may divide the opening 11 into two sub-openings: the first sub-opening 111 and the second sub-opening 112. The first direction x is on the plane having the organic light-emitting display panel.

In one embodiment, the isolation element 30 is disposed in the first sub-pixel 201; the isolation element 30 may divide the opening 11 into the first sub-opening 111 and the second sub-opening 112. The first sub-pixel 201 may still include one OLED 21. The first electrode 211 of the OLED 21 may be disposed in both the first sub-opening 111 and the second sub-opening 112.

In the disclosed organic light-emitting display panel, through disposing the isolation element 30 to diving the first opening 11 into two sub-openings, the scattered power of the light emitted from the first sub-pixel 201 of the OLED 21 may be increased. Accordingly, the brightness of the first sub-pixel 201 at the large viewing angle may be increased; and the blue tone issue of the image of the organic light-emitting display panel at the large viewing angle may be reduced; and the display quality/performance of the organic light-emitting display panel may be improved. In one embodiment, the isolation element 30 may be disposed in the middle of the opening 11; and may divide the opening 11 into the first sub-opening 111 and the second sub-opening 112 with a same area. Thus, the displayed image may be sufficiently uniform.

Further, the disclosed organic light-emitting display panel may include a thin-film transistor 40. The thin-film transistor 40 may be connected with the first electrode 211 of the OLED 21; and may be used to transmit electric signals to the first electrode 211.

Figure 10:
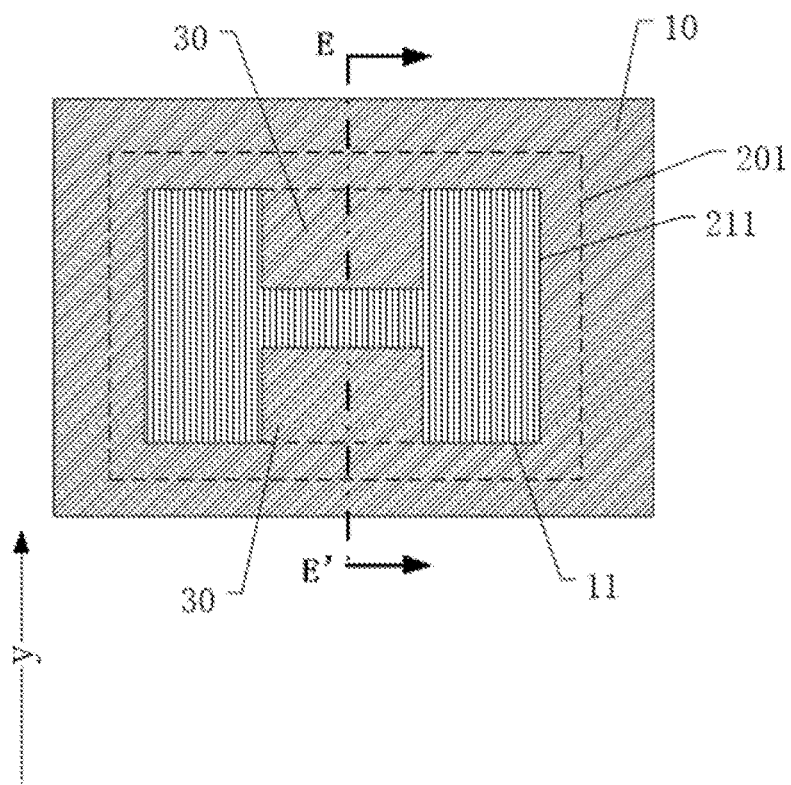
FIG. 10 illustrates a top view of another exemplary first sub-pixel in another exemplary organic light-emitting display panel consistent with the disclosed embodiments.
Figure 11:
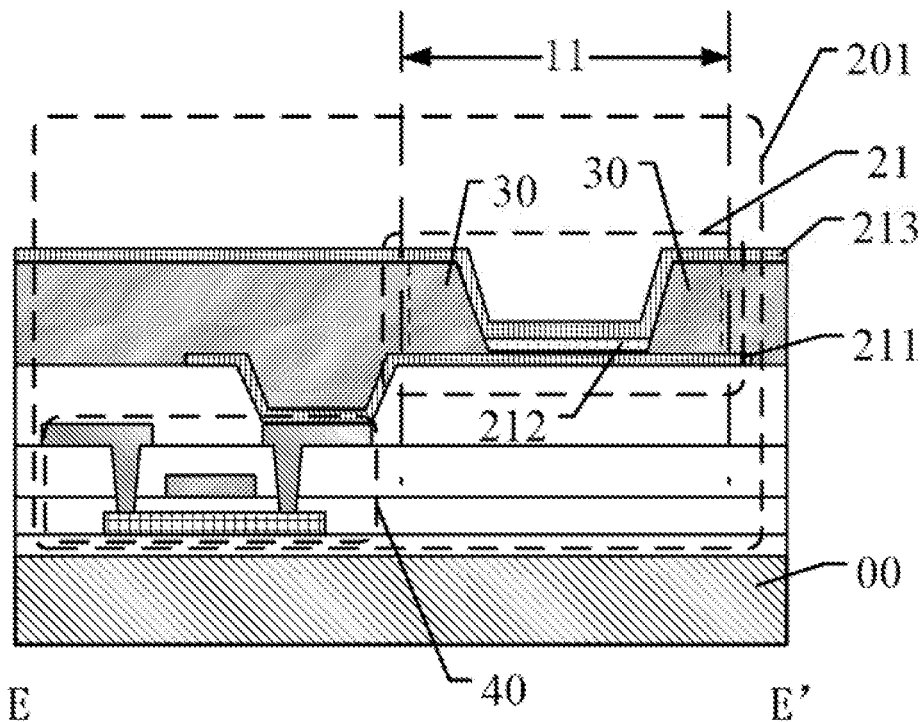
FIG. 11 illustrates an EE'-sectional view of the first sub-pixel in FIG. 10.

FIG. 10 illustrates a top view of another exemplary first pixel in another exemplary organic light-emitting display panel consistent with the disclosed embodiments; FIG. 11 illustrates an EE'-sectional view of the first pixel in FIG. 10.

As shown in FIG. 10 and FIG. 11. The isolation element 30 may extend along a second direction y. Along the second direction y, one end of the isolation element 30 may be disposed within the opening 11; and may not be connected with the sidewall of the opening 11; and the other end of the isolation element 30 may be connected with one sidewall of the opening 11. The second direction y is on the plane having the disclosed organic light-emitting display panel. In one embodiment, the isolation element 30 may extend from the sidewall of the opening 11; and extend into the opening 11. The isolation element 30 and the pixel definition layer 10 may be made of a same material; and may be disposed in a same layer. Thus, the isolation element 30 and the pixel definition layer 10 may be considered as one unified structure. The isolation element 30 may increase the area of the sidewall of the opening 11. Thus, the scattered power of the light emitted from the first sub-pixel 21 of the OLED 21 of the disclosed organic light-emitting display panel may be increased; and the brightness of the first sub-pixel 201 at the large viewing angle may be increased. Accordingly, the blue tone issue of the image of the disclosed organic light-emitting display panel at the large viewing angle may be reduced; and the display quality/performance of the disclosed organic light-emitting display panel may be enhanced. The number of the isolation elements 30 in one opening 11 may be one, two, three, or more. For illustrative purposes, two isolation elements 30 are illustrated in FIG. 11, which is not limited in the present disclosure.

Figure 12:
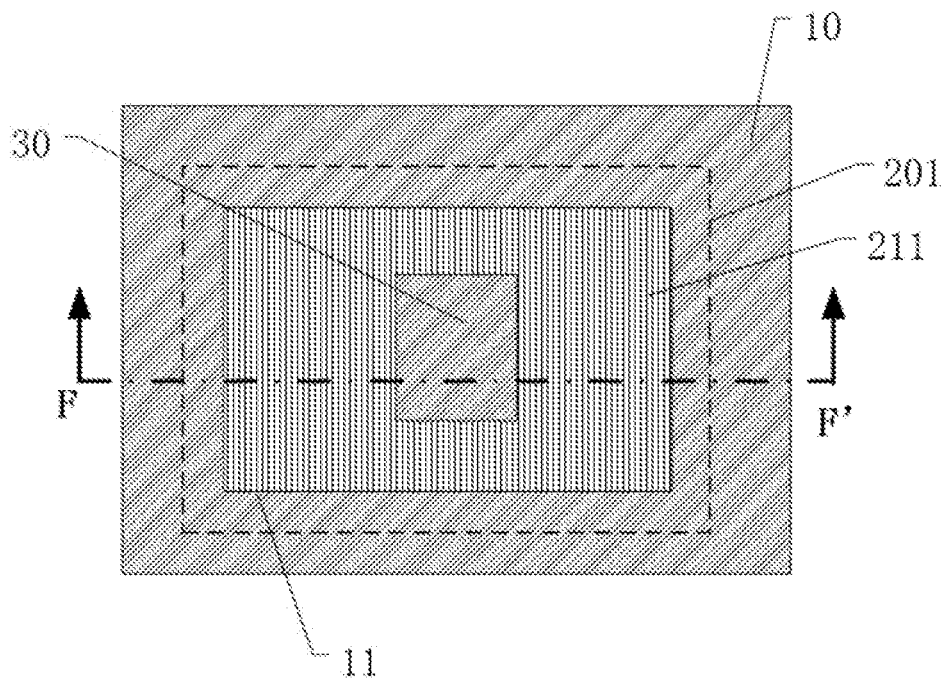
FIG. 12 illustrates a top view of another exemplary first sub-pixel of another exemplary organic light-emitting display panel consistent with the disclosed embodiments.
Figure 13:
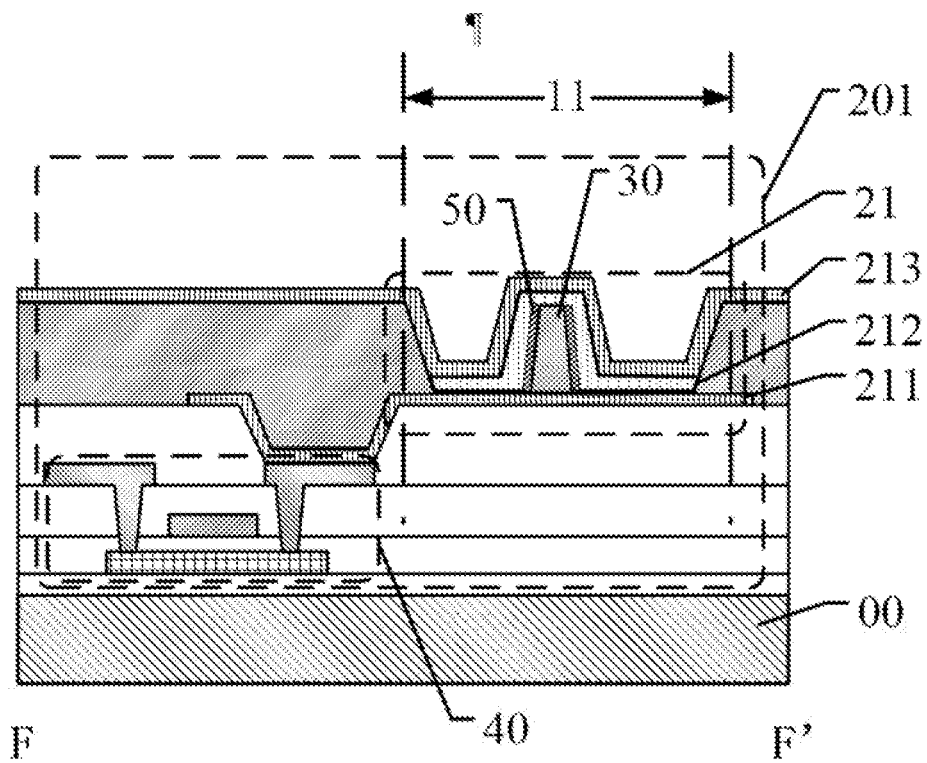
FIG. 13 illustrates an FF'-sectional view of the first sub-pixel in FIG. 12.
Figure 14:
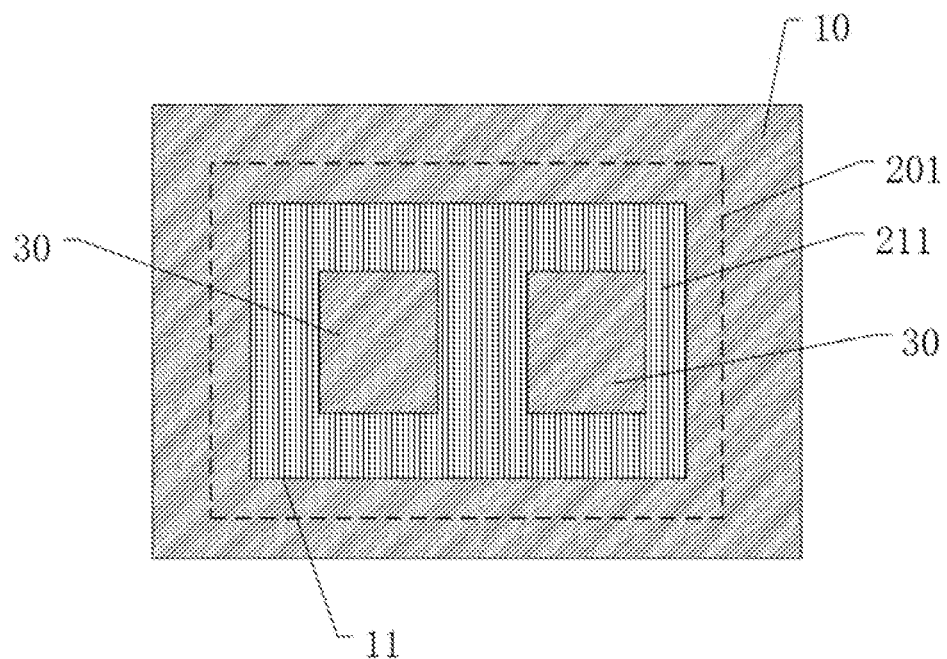
FIG. 14 illustrates a top view of another exemplary first sub-pixel in another exemplary organic light-emitting display panel consistent with the disclosed embodiments.

FIG. 12 illustrates a top view of another exemplary first pixel of another exemplary organic light-emitting display panel consistent with the disclosed embodiments; and FIG. 13 illustrates an FF'-sectional view of the first pixel in FIG. 12;

As shown in FIG. 12 and FIG. 13, the isolation element 30 may be disposed within the opening 11; and the isolation element 30 may not be connected with the sidewalls of the opening 11. Thus, the sidewalls of isolation element 30 may all scatter the light emitted from the OLED 21; and the scattered power of the light emitted from the first sub-pixel 201 of the OLED 21 may be increased. Accordingly, the brightness of the first sub-pixel 201 at the large viewing angle may be increased. Thus, the blue tone issue of the image of the disclosed organic light-emitting display panel at the large viewing angle may be reduced; and the display quality/performance of the disclosed organic light-emitting display panel may be enhanced. The number of the isolation elements 30 in one opening 11 may be one, two, three, or more, which is not limited in the present disclosure. For illustrative purposes, one isolation element 30 is illustrated in FIG. 12 and FIG. 13. In FIG. 14, the number of the isolation elements 30 is two. The scattered power of the light emitted from the first sub-pixel 201 of the OLED 21 may be further increased. Accordingly, the brightness of the first sub-pixel 201 at the large viewing angle may be increased. Thus, the blue tone issue of the image of the disclosed organic light-emitting display panel at the large viewing angle may be reduced; and the display quality/performance of the disclosed organic light-emitting display panel may be enhanced.

Further, referring to FIG. 13, to further increase scattered power of the light emitted from the first sub-pixel 201 of the OLED 21 using the isolation element 30, a scattering element 50 may be formed on a sidewall of the isolation element 30. At least a portion of the light emitted from the first sub-pixel 201 of the OLED 21 may be incident onto the scattering elements 50; and then may be scattered by the scattering elements 50. The scattered power of the scattering elements 50 may be substantially high. For example, the scattering elements 50 may be made of a metal material having a substantially high scattered power, such as silver, or aluminum etc. Disposing the scattering elements 50 on the sidewalls of the isolation element 30 may further increase scattered power of the light emitted from the first sub-pixel 201 of the OLED 21. Thus, the brightness of the first sub-pixel 201 at the large viewing angle may be further increased. Thus, the blue tone issue of the image of the disclosed organic light-emitting display panel at the large viewing angle may be reduced; and the display quality/performance of the disclosed organic light-emitting display panel may be enhanced.

Figure 15:
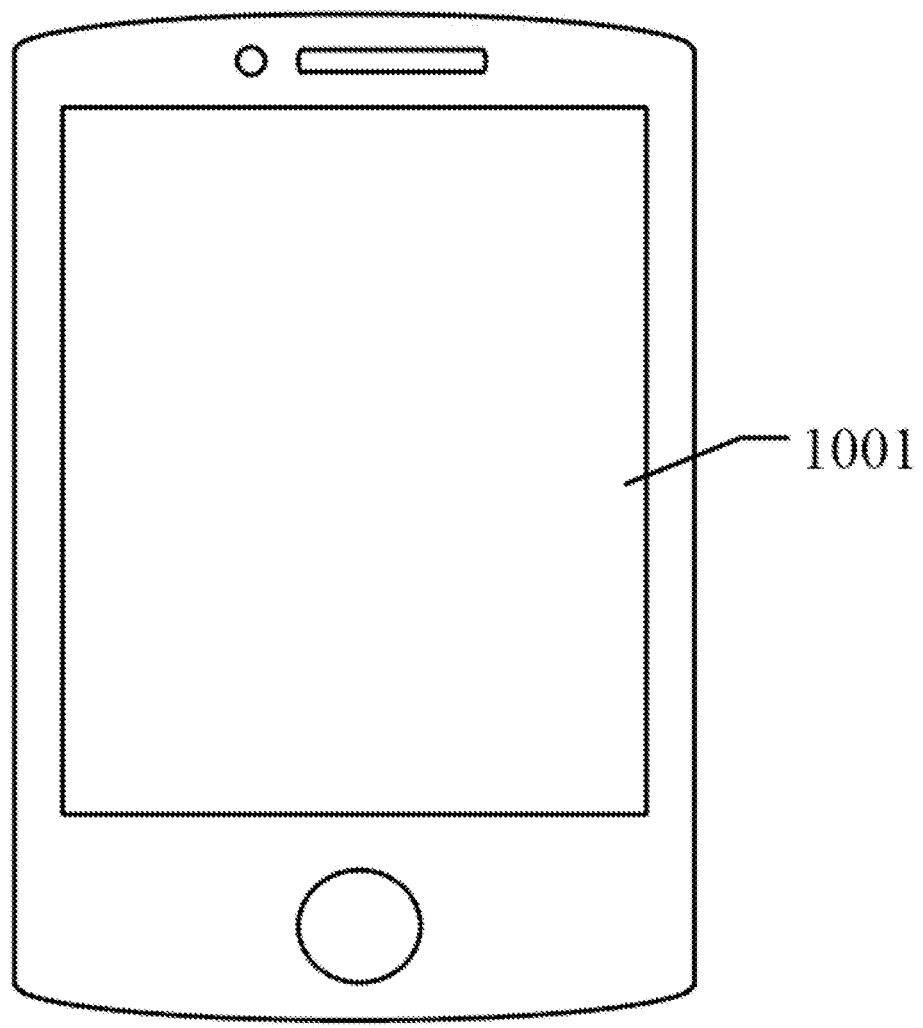
FIG. 15 illustrates an exemplary display apparatus consistent with various disclosed embodiments.

The present disclosure also provides a display apparatus. The display apparatus may include one of the disclosed organic light-emitting display panels. FIG. 15 illustrates a corresponding display apparatus consistent with various disclosed embodiments. The display apparatus 1000 may include one of the disclosed organic light-emitting display panel 1001. For illustrative purposes, a cell phone is illustrated in FIG. 15. In some embodiments, the display apparatus may be other display apparatus having the display function, such as a computer, a television, or an on-board display apparatus, etc. In one embodiment, the display apparatus may be a curved display apparatus. The disclosed display apparatus may include the disclosed organic light-emitting display panel. Thus, the blue tone issue at the large viewing angle may be reduced; and the display quality may be enhanced.

Thus, comparing with the existing technology, the disclosed organic light-emitting display panel and display apparatus may include at least following beneficial effects.

In the disclosed embodiments, at least one isolation element may be disposed in the opening corresponding to the first sub-pixel, the light emitted from the OLED may be incident onto the sidewalls of the isolation element; and a scattering effect may be generated. Further, the height of the isolation element may be substantially large. Thus, the height of the portion of the isolation element above the sidewalls of the OLED in the opening may be substantially large; and the area of the sidewalls of the isolation element may be increased. Thus, the scattered power of the light emitted from the OLED after incident onto the sidewalls of the isolation element may be increased. Comparing with the sub-pixel without having an isolation element, the scattered power of the light emitted from the first sub-pixel of the OLED may be increased. Thus, the brightness of the first sub-pixel at the large viewing angle may be increased. For example, the brightness of the red-pixel at the large viewing angle may be increased. Thus, the blue tone issue of the image of the disclosed organic light-emitting display panel at the large viewing angle may be reduced; and the display quality/performance of the disclosed organic light-emitting display panel may be enhanced.

The description of the disclosed embodiments is provided to illustrate the present invention to those skilled in the art. Various modifications to these embodiments will be readily apparent to those skilled in the art, and the generic principles defined herein may be applied to other embodiments without departing from the spirit or scope of the disclosure. Thus, the present disclosure is not intended to be limited to the embodiments shown herein but is to be accorded the widest scope consistent with the principles and novel features disclosed herein.

What is claimed is:

1. An organic light-emitting display panel, comprising:
a base substrate;
a pixel definition layer including a plurality of openings and disposed on the base substrate; and
a plurality of sub-pixels,
wherein:
a sub-pixel includes an organic light-emitting diode;
at least a portion of the organic light-emitting diode is disposed in an opening;
the plurality of sub-pixels include at least one first sub-pixel and at least one second sub-pixel; and
at least one isolation element is disposed in the opening corresponding to the first sub-pixel, and no isolation element is disposed in the opening corresponding to the second sub-pixel, such that, for a viewing angle greater than a certain range, a difference between a relative chromaticity attenuation rate of the first sub-pixel and a relative chromaticity attenuation rate of the second sub-pixel is reduced.

2. The organic light-emitting display panel according to claim 1, wherein:
the organic light-emitting diode includes a first electrode, a light-emitting material element and a second electrode;
each of the plurality of sub-pixels includes one first electrode; and
the first electrodes of the plurality of sub-pixels are independent from each other.

3. The organic light-emitting display panel according to claim 1, wherein:
the at least one isolation element and the pixel definition layer are disposed in a same layer;
a thickness of a portion of the pixel definition layer where the portion of the pixel definition layer is located outside the opening is d1, and a height of the at least one isolation element is d2, where d2≥d1;
the plurality of sub-pixels include a red sub-pixel, a green sub-pixel and a blue sub-pixel; and
the at least one first sub-pixel includes at least one red sub-pixel.

4. The organic light-emitting display panel according to claim 1, wherein the at least one first sub-pixel further comprises:
at least one green sub-pixel.

5. The organic light-emitting display panel according to claim 1, wherein:
the at least one isolation element and the pixel definition layer are made of a same material.

6. The organic light-emitting display panel according to claim 1, wherein:
the at least one isolation element along a first direction is stripe-shaped;
two ends of the at least one isolation element oppositely disposed along the first direction are connected to sidewalls of the opening respectively; and
the at least one isolation element divides the opening into two sub-openings,
wherein the first direction is in a plane having the organic light-emitting display panel.

7. The organic light-emitting display panel according to claim 1, wherein:
the at least one isolation element is extending along a second direction; and
along the second direction, one end of the at least one isolation element is disposed within the opening and not connected to a sidewall of the opening, and another end of the at least one isolation element is connected to a sidewall of the opening,
wherein the second direction is in a plane having the organic light-emitting display panel.

8. The organic light-emitting display panel according to claim 1, wherein:
the at least one isolation element is disposed within the opening; and
the at least one isolation element is not connected to a sidewall of the opening.

9. The organic light-emitting display panel according to claim 1, wherein the at least one isolation element further comprises:
a scattering element disposed on a sidewall of the at least one isolation element and configured to scatter at least a portion of light, which is emitted from the at least one first sub-pixel of the organic light-emitting diode and incident onto the scattering element.

10. The organic light-emitting display panel according to claim 1, wherein:
the organic light-emitting display panel is a curved display panel including a curved region and a flat region; and
the at least one first sub-pixel is disposed in the curved region.

11. The organic light-emitting display panel according to claim 1, wherein:
the at least one isolation element is made of at least one of resin, polyimide, organic silicon and silicon oxide.

12. A display apparatus, comprising:
an organic light-emitting display panel,
wherein the organic light-emitting display panel comprises:
a base substrate;
a pixel definition layer including a plurality of openings and disposed on the base substrate; and
a plurality of sub-pixels,
wherein:
a sub-pixel includes an organic light-emitting diode;
at least a portion of the organic light-emitting diode is disposed in an opening;
the plurality of sub-pixels include at least one first sub-pixel and at least one second sub-pixel; and
at least one isolation element is disposed in the opening corresponding to the at least one first sub-pixel, and no isolation element is disposed in the opening corresponding to the second sub-pixel, such that, for a viewing angle greater than a certain range, a difference between a relative chromaticity attenuation rate of the first sub-pixel and a relative chromaticity attenuation rate of the second sub-pixel is reduced.

13. The display apparatus according to claim 12 wherein:
the organic light-emitting diode includes a first electrode, a light-emitting material element and a second electrode;
each of the plurality of sub-pixels includes one first electrode; and
the first electrodes of the plurality of sub-pixels are independent from each other.

14. The display apparatus according to claim 12, wherein:
the at least one isolation element and the pixel definition layer are disposed in a same layer;
a thickness of a portion of the pixel definition layer where the portion of the pixel definition layer is located outside the opening is d1, a height of the at least one solation element is d2, where $d2 \geq d1$;
the plurality of sub-pixels include a red sub-pixel, a green sub-pixel and a blue sub-pixel; and
the at least one first sub-pixel includes at least one red sub-pixel.

15. The display apparatus according to claim 12, wherein the first sub-pixel further comprises:
at least one green sub-pixel.

16. The display apparatus according to claim 12, wherein:
the at least one isolation element and the pixel definition layer are made of a same material.

17. The display apparatus according to claim 12, wherein the isolation element further comprises:
a scattering element is disposed on a sidewall of the at least one isolation element configured to scatter at least a portion of light, which is emitted from the at least one first sub-pixel of the organic light-emitting diode and incident into the scattering element.

18. The display apparatus according to claim 12, wherein:
the organic light-emitting display panel is a curved display panel including a curved region and a flat region; and
the at least one first sub-pixel is disposed in the curved region.

19. The display apparatus according to claim 12, wherein:
the organic light-emitting display panel is a flat display panel.

20. The display apparatus according to claim 12, wherein:
the at least one isolation element is made of at least one of resin, polyimide, organic silicon and silicon oxide.

* * * * *